United States Patent [19]

Yonezu et al.

[11] 4,003,074
[45] Jan. 11, 1977

[54] HERMETICALLY-SEALED INJECTION SEMICONDUCTOR LASER DEVICE

[75] Inventors: Hiroo Yonezu; Izuo Hayashi, both of Tokyo, Japan

[73] Assignee: Nippon Selfoc Company, Limited, Tokyo, Japan

[22] Filed: Oct. 29, 1974

[21] Appl. No.: 519,051

[30] Foreign Application Priority Data

| | | |
|---|---|---|
| Dec. 3, 1973 | Japan | 48-139268[U] |
| Dec. 3, 1973 | Japan | 48-139269[U] |
| Dec. 3, 1973 | Japan | 48-139270[U] |

[52] U.S. Cl. ............................ 357/74; 357/17; 357/18; 357/19; 357/81; 331/94.5 D
[51] Int. Cl.² ............... H01L 23/02; H01L 23/12; H01L 33/00; H01L 33/19
[58] Field of Search ............ 357/17, 18, 19, 74, 357/81; 331/94.5

[56] References Cited

UNITED STATES PATENTS

| | | | |
|---|---|---|---|
| 3,303,432 | 2/1967 | Garfinkel et al. | 357/81 |
| 3,354,316 | 11/1967 | Deverall | 357/19 |
| 3,568,087 | 3/1971 | Phelan | 357/18 |
| 3,675,150 | 7/1972 | Harris et al. | 357/18 |
| 3,701,043 | 10/1972 | Zuleeg et al. | 357/18 |
| 3,787,782 | 1/1974 | Tjassens | 357/74 |
| 3,816,847 | 6/1974 | Nagao | 357/81 |
| 3,840,889 | 10/1974 | O'Brien et al. | 357/81 |
| 3,842,262 | 10/1974 | Heitman et al. | 357/74 |
| 3,855,546 | 12/1974 | Carr | 357/18 |

OTHER PUBLICATIONS

Proceeding of the IEEE; Embedded Diodes and Heat Sinks for Avalanche Diodes, vol. 60, No. 8, Aug. 1972.

*Primary Examiner*—Andrew J. James
*Attorney, Agent, or Firm*—Hopgood, Calimafde, Kalil, Blaustein & Lieberman

[57] ABSTRACT

A hermetically sealed injection semiconductor laser device includes a hollow cylinder in which a crystal laser pellet is enclosed. The ends of the cylinder are sealed by metal electrodes one of which projects axially into the cylinder and is connected to an electrode surface of the crystal pellet. A lens element is disposed within the cylinder.

5 Claims, 6 Drawing Figures

HERMETICALLY-SEALED INJECTION SEMICONDUCTOR LASER DEVICE

BACKGROUND OF THE INVENTION

The present invention relates to a hermetically sealed injection semiconductor laser device, and more particularly to such a device in which a crystal layer pellet and a lens element are disposed within a sealed hollow cylinder.

The incorporation of a double heterostructure into an injection semiconductor laser has made possible continuous oscillation at room temperature. The life expectancy of this type of laser device has been much improved by recent technical developments, and semiconductor lasers capable of continuous oscillation at room temperature for more than 10,000 hours, with a light output on the order of 10 mw may now be achievable. Contemporaneously with the development of various stripe structures, it has become feasible to efficiently control the mode of laser light. Under the circumstances, the advent of practicable and easily operable injection semiconductor laser devices has been awaited. However, a problem that remains to be solved, is the construction of the casing for the laser elements.

The semiconductor laser permits high-speed direct-modulation at frequencies on the order of gigahertz, and the output laser beam is emitted in two opposite directions unless special provisions are made to prevent this. One known, commercially available package such as the RCAOP-3 made by RCA Corp. has a structure similar to a well-known transistor cap. (The RCAOP-3 has a glass top, instead of metal.) This structure, however, has very significant practical disadvantages. For example, it has an elongated terminal through which current is supplied, resulting in increased inductance and capacitance which degrades its high frequency characteristics. Furthermore, in this structure, the output laser beam is derived from only one side. On the other side, the laser beam is scattered as waste or totally reflected back by a fully reflective film coating on the end of the laser crystal. It is more desirable that the output laser beam be used in both directions. For example, one laser beam can be utilized for monitoring purposes. When the light output is suitably fed back to the drive current circuit, one laser beam can be used to suppress output variations attributable to changes in ambient temperature, characteristic deterioration or other factors. The two output laser beams can be used in combination, or a laser amplifier can be formed when one laser beam is used as an input, and the other as an output in an amplifying stage maintained by suitably coating the laser crystal with antireflective film.

Another known casing structure is arranged such that the laser crystal is directly epoxy-molded as in a light-emitting diode. This structure, however, has not as yet achieved sufficient reliability and heat-dissipation to be of practical utility.

The injection semiconductor laser emits its output laser beam at a relatively large angle of divergence. For practical applications, this divergent laser beam must often be converted into a parallel beam by an optical system, as in the ordinary gas laser and solid-state laser, or into a convergent beam to be adapted to glass fiber optical transmission cables. In the prior art, no substantial improvements have been made on this point.

SUMMARY OF THE INVENTION

It is an object of the present invention to provide an injection semiconductor laser device which makes two laser beams available from two mirror surfaces, having excellent high frequency characteristics, operable for continuous oscillation at room temperature, and readily manufacturable at low cost.

It is another object of the invention to provide an injection semiconductor laser device capable of converting a widely divergent laser beam from the laser pellet into a quasi parallel or convergent beam.

With these and other objects in view, the invention provides a hermetically sealed injection semiconductor laser device comprising: a pair of metal electrodes; a cylindrical body of transparent insulating material with said electrodes hermetically sealed to its ends and with one of said electrodes protruding axially into its interior; a semiconductor laser crystal pellet having one of its electrode surfaces thermally and electrically connected to the end of the protruding metal electrode; a flexible lead wire for electrically coupling the other pellet electrode surface to the remaining metal electrode, and a lens element installed in the hollow cylindrical body for converting the light rays into substantially parallel or convergent light rays. The protruding metal electrode supporting the laser crystal pellet serves as a heat absorbing body and may be connected to a heat sink structure, or formed as a part of a heat sink structure. Alternatively, part of the metal body may be replaced with an electrically insulating, thermally conductive material.

The invention has several additional objectives and conditions to be met in providing its preferred semiconductor laser device; that is, to derive two opposing laser beams from the end surfaces of the laser pellet; to make the laser operable at higher frequencies; to enable the laser to maintain continuous oscillation at room temperature; to allow the laser pellet to be installed in a hermetically sealed structure; to prevent the laser crystal pellet from being subjected to excess stress during the process of bonding the lead wire to the crystal pellet; and to make the miniaturization of the laser device possible with ease and at low costs on a mass-production basis.

A pair of reflective surfaces of a semiconductor laser are conventionally formed by cleavage, and laser beams of the same output are emitted from both end surfaces in opposite directions. This construction is advantageous when the two laser beams are used together. In optical communications, it is further advantageous when one of the laser beams is used for signal transmission, while the other is for monitoring. In the stripe-geometry laser with a limited narrow active region to permit mode control, the light output is normally about 10 mw where an operating point as low as about 20 mA above the threshold current is chosen in order to prevent deterioration of the laser element. The threshold current varies with changes in the ambient temperature and with the aging of the element. The threshold value is as delicate and sensitive as about 1 mA per degree centigrade near room temperature. This makes it extremely difficult to keep the laser output constant over a long period of time. The use of a temperature control device with the laser device is inconsistent with the desirability of the semiconductor laser, that is, small size, light weight, and low cost. One solution to this problem is to detect the output of one of the two laser beams and feed it back to the laser drive current circuit to control the operating current. Thus stable laser output is obtained. In practice, the use of a transparent hollow cylinder is very workable in deriving laser beams. In the construction for laser output available in two directions, an optical amplifier can be formed in such manner that the reflective surface is coated with an antireflective film to establish an amplifying state, and then a light beam is fed into the laser crystal from the antireflective surface by way of one beam system whereby this light beam is amplified and emitted from the antireflective surface on the other side.

As known from the fundamental behavior of the laser element, direct current modulation is feasible at frequencies on the order of gigahertz. It is therefore desirable that the resonant frequency of the case lie in the region above the modulation frequency. Assume that the transparent hollow cylinder is glass and that the two metal bodies constituting the electrodes at the top and bottom of the cylinder have a structure such as a disc offering little inductance. In this construction, the capacitance is small because the dielectric constant of glass is as low as about 2, with the result that the case can be adapted to operation at sufficiently high frequencies. The resonant frequency of the case can be several gigahertz, which is readily inferable from the characteristic of a case from a Gunn diode or an IMPATT diode.

The most important key to continuous oscillation at room temperature is to increase the efficiency of heat dissipation from the laser pellet. To prevent the temperature of the casing from rising, it is necessary that the metal electrode kept in direct contact with the laser pellet be integrally formed with a heat sink structure, or that a part of the metal electrode be threaded or that link holes be provided on the metal electrode in preparation for effective coupling to a heat sink structure. Hermetic sealing is indispensable since the semiconductor laser crystal is vulnerable to moisture. Hence it is desirable that the casing be sealed to the remaining upper metal electrode by welding after the laser pellet is housed therein and bonded thereto.

It is also desirable that a flexible lead wire, such as gold wire, be used for connecting between an electrical terminal and the electrode of the laser pellet on the side opposite the heat sink structure. The connection can be made by fusing with an easily melting metal such as tin and solder. If a solid body is used instead of a soft lead wire to connect therebetween, a large strain is imposed on the laser crystal, resulting in the reduction of the life of the laser element.

It is apparent that the present invention makes it readily possible to manufacture small-size, easily operable, and low-cost semiconductor laser devices. The use of commercially available glass cylinders will serve to diminish the cost of the device to a great extent. Thus, as described above, all the important characteristics required for an ideal, hermetically sealed injection semiconductor laser are satisfied according to the invention.

BRIEF DESCRIPTION OF THE DRAWINGS

A more detailed understanding of the features and advantages of the invention will become apparent from the following description taken in conjunction with the accompanying drawings wherein.

DESCRIPTION OF THE PREFERRED EMBODIMENTS

Figure 1:
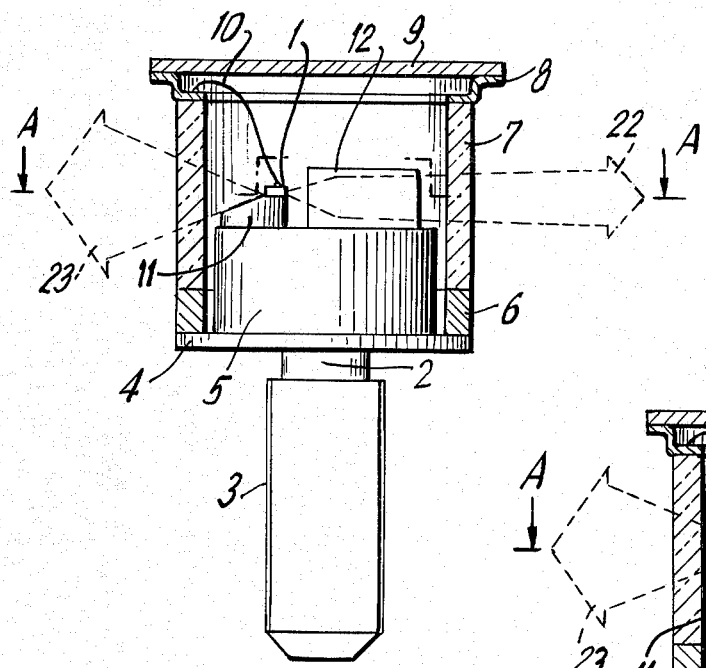
FIG. 1 is a longitudinal sectional view showing an embodiment of the invention.
Figure 2:
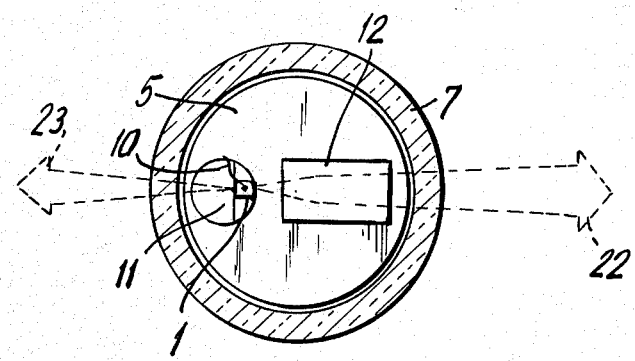
FIG. 2 is a lateral sectional view taken along the line A-A' of the device of FIG. 1.

With reference now to FIGS. 1 and 2, a sectional view is shown to illustrate one semiconductor laser device which embodies the invention, wherein a laser crystal pellet 1 is installed in a hermetically sealed casing structure. A metal body 2 is formed of copper having a threaded portion 3, 10 mm in length and 4 mm in diameter, a projecting portion 5, 7.5 mm in outer diameter, and a flange portion 4, 3 mm below the top of the projecting portion, 0.5 mm in thickness and 10 mm in outer diameter. A Kovar ring 6, 10 mm in outer diameter, 8 mm in inner diameter and 1.5 mm in thickness, is fitted onto the flange portion 4 by metal fusing. Kovar is a trademark for an alloy containing approximately 29% Nickel, 17% Cobalt and 0.3% Manganese, the balance being essentially iron. A glass cylinder 7, 10 mm in outer diameter, 8 mm in inner diameter and 3 mm in length, and a Kovar ring 8, 12 mm in outer diameter, 8 mm in inner diameter, 0.3 mm in thickness and with a step 1 mm high, are fitted successively onto the Kovar ring 6 by metal fusion. Both the ends of the glass cylinder 7 are metallized beforehand by a known sintering process. The laser crystal pellet 1 is installed in full contact with the top end of a copper heat sink member 11, 2 mm in diameter and 1 mm in height, so that the output laser beam is prevented from dispersing. The laser crystal pellet 1 is about 80 microns thick, comprising an active layer located 3 microns from the surface of the p-type layer. This p-type layer has contact with the heat sink disc 11, which is fitted onto the projecting portion 5 after the pellet 1 is installed on the end of heat sink which forms a first metal electrode. The other electrode surface, i.e., the n-type surface of the pellet, is connected to the stepped Kovar ring 8 by way of a gold lead wire 10 to form a second electrode.

The output beams from the semiconductor laser are asymmetric in two directions; the angle of divergence is typically about 80° in the direction perpendicular to the PN junction, and about 10° in the direction parallel to the PN junction. The cross section of the beam is extremely elliptic in both directions. Hence the output laser beam diverges widely after leaving the casing, resulting in limitations on laser applications.

The parallelism of the output beam from a semiconductor laser is considered important in general laser applications, although the divergence of a laser beam is not significant in certain fields of use. A focusing laser beam is needed from time to time when the transmission path is formed of a glass fiber.

For the above-mentioned focusing purpose, a lens element 12, 3.5 mm in length and 2 mm in diameter, is fitted in position with epoxy resin in such manner that the central axis of the lens element 12 is aligned with the oscillation region and axis of the crystal pellet 1. A groove or a step may be formed in advance on the top surface of the portion 5 to facilitate the alignment. In the final step, the case is sealed off with a disc-shaped metal cover 9 of Kovar, 12 mm in outer diameter and 0.5 mm in thickness, by welding in a dry nitrogen atmosphere. The other constructional and functional features of this laser glass fiber adapted device are the same as those of the previous embodiment.

In the construction as shown in FIGS. 1 and 2, the laser crystal pellet 1 and the lens element 12 are spaced by 1.2 mm, and the lens element is 3.5 mm long whereby a quasi-parallel laser beam 22 is obtained. When the lens element is such that its refractive index is in a square distribution gradient from the central axis towards the periphery, it is somewhat inaccurate to consider the oscillation region (near visual field image) as a point light source. Hence the output beam obtained is not perfectly parallel but elliptic and becomes quasi-parallel as it is propagated. Even this elliptical beam or quasi-parallel beam is far better in shape than one obtained without a lens function. The laser beam 23 on the side opposite the lens element is largely divergent; however, this beam can serve the purpose of monitoring or stabilizing the laser light output. It is advantageous that the quasi-parallel beam can be used nearly in the same sense as in a known gas laser or solid-state laser. For application to glass fiber optical transmission, a lens element such as a Selfoc lens of suitable refractive index distribution and length is installed in position to derive a focusing beam to be adapted to the glass fiber optical cable. Although the glass cylinder 7 serves as a convex lens, this effect is very small. For example, when the output beam is coupled through the glass cylinder into a Selfoc fiber optical transmission cable, for which the spot size is 4 microns, being so small that extra care is needed in the optical coupling, the coupling efficiency can be only 10% lower in the cylindrical glass than in the flat glass.

FIG. 2 is a lateral sectional view taken along the line A-A' passing through the center axis of the laser crystal pellet 1 and the lens element 12 in the structure shown in FIG. 1. The laser crystal pellet 1 and the lens element 12 are installed with their optical axes aligned with the diametric direction of the glass cylinder so as not to cause the laser beam 22 to be greatly deformed by the convex lens function of the glass cylinder. The lens element 12 installed in the glass cylinder case 7 may be of various types and constructions such as a cylindrical Selfoc lens, a plane Selfoc lens, a semi-cylindrical lens and simply a hollow glass cylinder, as well as a volume hologram, depending on the design requirements. The gap between the laser crystal pellet 1 and the lens element 12 may be filled with epoxy resin to increase the coupling efficiency therebetween. When the laser device is operated for a small light output, the light entering through the glass cylinder as noise can become significant. To avoid this, the glass cylinder may be coated with black paint, excepting the portion where the laser beam passes through.

The laser beam 23 can also be optically reformed through a lens element in the manner described above for the laser beam 22 whereby the laser beams in two directions can be used together. This arrangement will make two parallel beams available. When both the reflective surfaces of the laser are coated with antireflective films to establish an amplifying state, and both beams are treated through a lens arrangement to be adapted to a glass fiber cable, then an optical amplifier can be formed. For example, a weak light beam from one glass fiber cable is applied to one end of the laser crystal. This beam is amplified in the laser crystal, emitted from the other end and passed to another glass fiber cable.

The heat sink disc 11 may be a diamond heat sink structure or any other suitable structure. The laser crystal pellet may be installed by way of a thickly plated gold layer in order to prevent the laser beam from being dispersed due to the heat sink disc 11.

As described above, the glass cylinder offers a convex lens function in the direction of curvature of the cylinder (not in the axial direction of the cylinder). The quasi-parallel or focusing light beam obtained through the lens element in the cylindrical casing is deformed into a beam that is not circularly symmetrical. The spot size of the light beam is changed as a result. If this occurs in spite of a need for perfect spot-size matching for the coupling of a laser beam with a glass fiber optical transmission cable having a small eigen spot size coupling loss and higher order modes are produced to cause mode dispersion and propagation loss to be increased. This problem can be solved by an arrangement in which the portion of the glass cylinder through which the laser beam passes is optically flattened in a plane perpendicular to the laser beam. In practice, a commercially available glass cylinder is made partly flat with a jig by heating. This process is a simpler, easier and more economical solution to the problem than the use of flat plates which are bonded together or the use of various tubular bodies such as square tubes.

Figure 3:
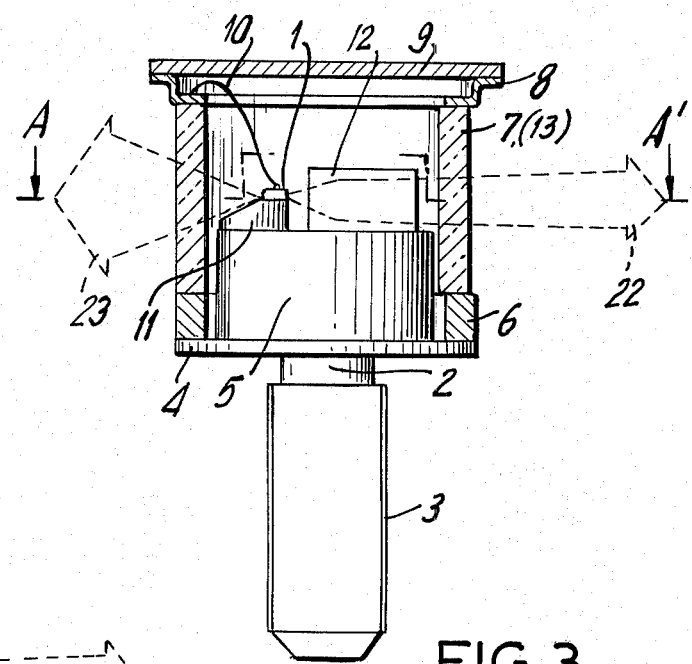
FIG. 3 is a longitudinal sectional view showing another embodiment of the invention.
Figure 4:
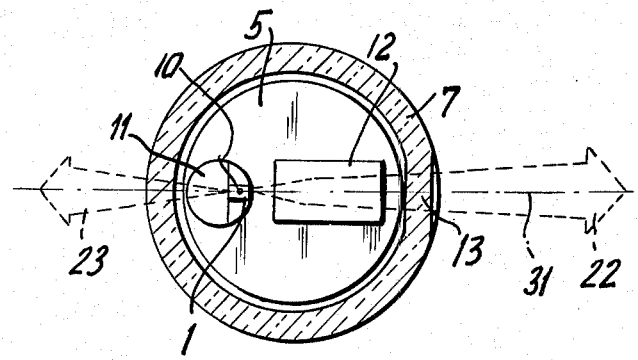
FIG. 4 is a lateral sectional view taken along the line A-A' of the device of FIG. 3.

An embodiment is illustrated in FIGS. 3 and 4 which show a longitudinal and cross sectional view, with the latter taken along the line A-A'. This embodiment is the same as that shown in FIGS. 1 and 2, with the exception of the glass cylinder shape. The glass cylinder 7 is heated and partly shaped into an optically flat portion 3 mm wide. Then the glass cylinder is cut to a length of 3 mm and fitted onto a Kovar ring 6 by fusing. Referring to FIG. 4, the oscillation axis of a laser crystal pellet 1 and the optical axis 31 of a lens element 12 are aligned with a diametric axis of the cylindrical body 7. The optical axis 31 passes nearly perpendicularly through the center of the optically flat portion 13 of the cylindrical body. If the optical axis 31 is not perpendicular to the optically flat portion 13, the laser beam 22 will be refracted. In experiments, a coupling efficiency as high as 60 to 70% was obtained when quasi-parallel light was coupled to a glass fiber cable having a spot size of 4 microns. (Coupling at this spot size calls for extra consideration.) According to the invention, an elliptic laser beam can be converted into a focusing circular beam through a lens having an elliptic lens function whereby the output laser beam is efficiently coupled to a glass fiber optical transmission cable even if the spot size is small. In experiments, the coupling efficiency was as high as 80% for a glass fiber cable having a spot size of 4 microns.

Figure 5:
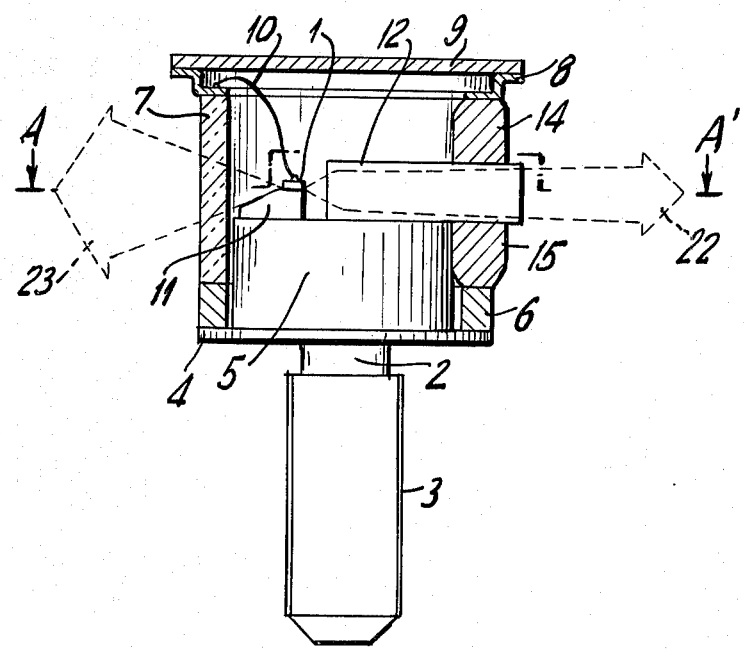
FIG. 5 is a longitudinal sectional view showing still another embodiment of the invention.
Figure 6:
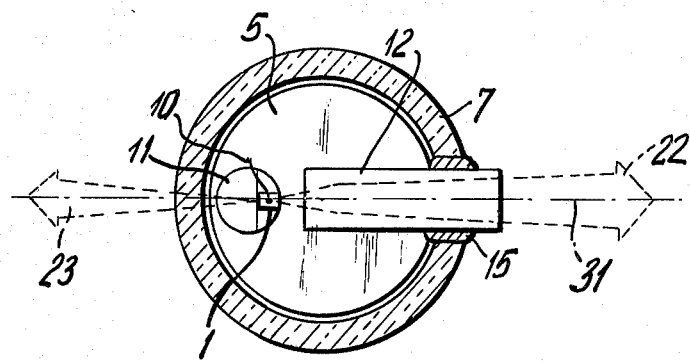
FIG. 6 is a lateral sectional view taken along the line A—A' of the device of FIG. 5.

Another embodiment of the invention is schematically shown in FIGS. 5 and 6 wherein a lens element is installed extending through a cylindrical casing of the structure shown in FIGS. 1 and 2 in order to remove the influence of reflection and refraction of the laser beam in the glass cylinder. FIG. 5 is a longitudinal sectional view and FIG. 6 is a lateral sectional view taken along a line A-A' passing a laser crystal pellet 1. A slot or an opening is provided in a part of the transparent cylindrical body. A lens element and light transmission body is fitted in the slot or opening and hermetically molded with epoxy resin or the like. This arrangement contributes to a reduction in the necessary diameter of the transparent cylindrical body, which makes the cylindrical body adaptable to higher frequencies. In the construction having the lens element within the cylindrical body, the reflectivity accounts for 14%, 7% on the input and output surfaces of the cylinder and 7% on the input and output surfaces of the lens element, against an incident beam perpendicular to the surface of the cylinder. This much of the reflection loss can be eliminated by installing the lens element and light transmission body 12 to extend through the cylindrical body. The reflection loss can be made nearly zero when the lens element and light transmission body 12 are coated with an antireflective film. Thus the output laser beam can be emitted with high efficiency.

More specific features of this embodiment will be described below in contrast to the embodiment shown in FIGS. 1 and 2. In FIG. 5, a Selfoc lens 12 in the shape of a cylinder is used for the lens element and light transmission body. This lens is fitted in slot 14 formed in the wall of a glass cylindrical body 7 and hermetically molded with epoxy resin 15. A metal body made of copper has an integrally formed threaded portion 3, 7 mm in length and 3 mm in diameter, a projection portion 5, 3 mm in outer diameter, and a flange portion 4, 5 mm in outer diameter, 0.5 mm in thickness, with a step 3 mm high. A Kovar ring 6, 5 mm in outer diameter, 3.5 mm in inner diameter and 1.5 mm in thickness, is fitted onto the flange portion 4 by metal fusing. A glass cylinder 7, 5 mm in outer diameter, 3.5 mm in inner diameter and 3 mm in length, having a portion 14, 2.2 mm wide where glass is removed by slot forming, if fitted onto the Kovar ring 6 by metal fusion. Then a Kovar ring 8, 6 mm in outer diameter, 3.5 mm in inner diameter, 0.3 mm in thickness, with a step 1 mm high, is fitted onto the cylindrical body 7 by metal fusion. The gap between the laser crystal pellet 1 and the lens element and light transmission body 12 is 1.2 mm, and the length of the lens element and light transmission body 12 is 3 mm, the components of which are arranged to derive quasi-parallel laser beam 22 from the laser crystal.

The laser crystal pellet 1 is about 80 microns thick, comprising an active layer 3 microns from the p-type surface, which is in contact with a heat sink disc 11. The heat sink disc 11 is bonded to the top 5 of a metal body 2 after the laser crystal pellet 1 is fitted to the heat sink. The other electrode (on the n-type side of the pellet 1) is connected through a gold lead wire 10 to a stepped Kovar ring 8. The lens element and light transmission body 12, 3 mm in length and 2 mm in diameter, is installed extending through the 2.2 mm wide slotted portion 14 of the glass cylindrical body 7. The lens element and light transmission body 12 is fitted therein and temporarily fastened with epoxy resin 15. The laser crystal pellet 1 has its oscillation region and oscillation direction aligned with the center axis of the lens element and light transmission body 12. Then, in the last step, a Kovar plate electrode 9 is fitted onto the cylindrical body by welding in a atmosphere of dry nitrogen, and any gap around the lens element and light transmission body 12 is filled with epoxy resin so that the cylindrical body is hermetically sealed.

The inductance of the cylindrical casing is very small, of which such a small element as the gold wire 10 accounts for the largest part. This makes the casing well adaptable to frequencies near 10 GHz. The laser crystal pellet 1 may be bonded directly to the top of the projecting portion 5 without using the heat sink structure 11 by suitably constructing the projecting portion 5 which has a thermal resistance below 15° C/w.

According to this embodiment, the lens element and light transmission body 12 is installed extending through the glass cylindrical body 7, and the laser beam 22 is emitted through this lens element, with the result that the laser beam 22 is free of reflection losses due to the glass cylindrical body. If the two ends of the lens element 12 are coated with antireflective film, it becomes feasible to realize a semiconductor laser case which offers no reflection loss. This is a noteworthy feature of the embodiments of FIGS. 5 and 6 since it is difficult to coat the inner surface of the cylindrical body with an antireflective film.

Quasi-parallel laser beams obtained in the semiconductor laser device of this invention can be used in the same way as those obtained from known gas lasers or solid-state lasers. Focusing light can be obtained by the use of a suitable lens element such as a Selfoc lens. To adapt the focusing light to a glass fiber light transmission path, it is necessary to suitably determine the refractive index distribution, the length, and the setting position of the Selfoc lens.

As in the previous embodiment, a circular, cylindrical Selfoc lens, a plane Selfoc lens, a semi-circular cylindrical lens, a cylindrical glass body, or other suitable lens body may be used for the lens element and light transmission body 12 which is fitted in the slot portion 14 of the glass cylinder 7. The portion of the glass cylindrical body 7 where the lens element 12 is extended is 2.2 mm wide as shown in FIG. 7. This slot portion may instead be an opening, if it is convenient for the purpose of fitting the lens element 12 in position.

While a few embodiments of the invention have been illustrated and described in detail for purposes of explanation and illustration, it should be understood that the invention is not limited to these exemplary embodiments. Numerous variations and modifications falling within the scope of the invention will occur to those skilled in the art.

We claim:

1. A hermetically sealed injection semiconductor laser device comprising:
   a pair of metal electrodes;
   a hollow generally cylindrical body of transparent insulating material having said pair of metal electrodes hermetically sealed to its ends and having one of said pair of metal electrodes protruding axially into its interior;
   a semiconductor laser crystal pellet having an electrode surface thermally and electrically connected to the end of said protruding metal electrode with its light-emitting ends facing the wall of said hollow cylindrical body for emitting light rays in two opposite directions;
   a flexible lead wire for electrically coupling another electrode surface of said pellet to the other of said pair of metal electrodes; and
   a lens element at least partially disposed within said hollow cylindrical body and having its optical axis substantially perpendicular to the wall of said hollow cylindrical body, for converting said light rays into focussed or substantially parallel light rays, whereby said light rays are derived from two portions of the wall of said hollow cylindrical body.

2. A hermetically sealed injection semiconductor laser device as set forth in claim 1 wherein said hollow cylindrical body has at least one flat portion lying on an extension of the optical axis of said lens element.

3. A hermetically sealed injection semiconductor laser device as set forth in claim 1 wherein said lens element is made of a cylindrical body and extends radially through said hollow cylindrical body.

4. A hermetically sealed injection semiconductor laser device as set forth in claim 1 wherein said lens element is disposed entirely within said cylindrical body.

5. A hermetically sealed injection semiconductor laser device as set forth in claim 1 wherein the protruding end of said protruding metal electrode defines at least one step to facilitate the alignment of said lens element with said crystal pellet.

* * * * *